United States Patent
Garcin

[11] Patent Number: 5,913,702
[45] Date of Patent: Jun. 22, 1999

[54] LOW CROSS-TALK NETWORK CONNECTOR

[75] Inventor: Michel Garcin, Pontarlier, France

[73] Assignee: Framatome Connectors International, Courbevoie, France

[21] Appl. No.: 08/776,397

[22] PCT Filed: Aug. 2, 1995

[86] PCT No.: PCT/FR95/01042

§ 371 Date: Apr. 8, 1997

§ 102(e) Date: Apr. 8, 1997

[87] PCT Pub. No.: WO96/05635

PCT Pub. Date: Feb. 22, 1996

[30] Foreign Application Priority Data

Aug. 8, 1994 [FR] France .................................. 94 09812

[51] Int. Cl.[6] .................................................. H01R 23/02
[52] U.S. Cl. ........................................... 439/676; 439/941
[58] Field of Search ................................... 439/941, 676, 439/638, 76.1, 404, 405; 333/1, 12

[56] References Cited

U.S. PATENT DOCUMENTS 4,790,769  12/1988  Kanada ..................................... 439/344
5,299,956   4/1994  Brownell et al. ........................ 439/638
5,536,182   7/1996  Atoh et al. ............................... 439/404

FOREIGN PATENT DOCUMENTS 0 558 225 A1  9/1993  European Pat. Off. .
0 598 192 A1  5/1994  European Pat. Off. .

*Primary Examiner*—Neil Abrams
*Assistant Examiner*—Barry M. L. Standig
*Attorney, Agent, or Firm*—Pollock, Vande Sande & Amernick

[57] ABSTRACT

Low cross-talk network connector comprising a base plate (11) of an insulating material including several inlets (A, ..., H) and outlets (1, ..., 8) electrically interconnected by means of electrical conductors arranged at intervals therealong. The base plate is removably mounted in a housing (20) including means for electrically connecting the base plate outlets with the external outlet conductor wires, the inlets (A, ..., H) of the base plate being connected to the means for electrically connecting the internal inlet conductor wires. The base plate (11) comprises two substantially perpendicular planes, the inlets (A, ..., H) being located in a first plane and the outlets (1, ..., 8) being located in a second plane, each inlet being connected to the corresponding outlet by a lead (10) with a first portion extending in the first plane and a second portion extending in the second plane.

13 Claims, 11 Drawing Sheets

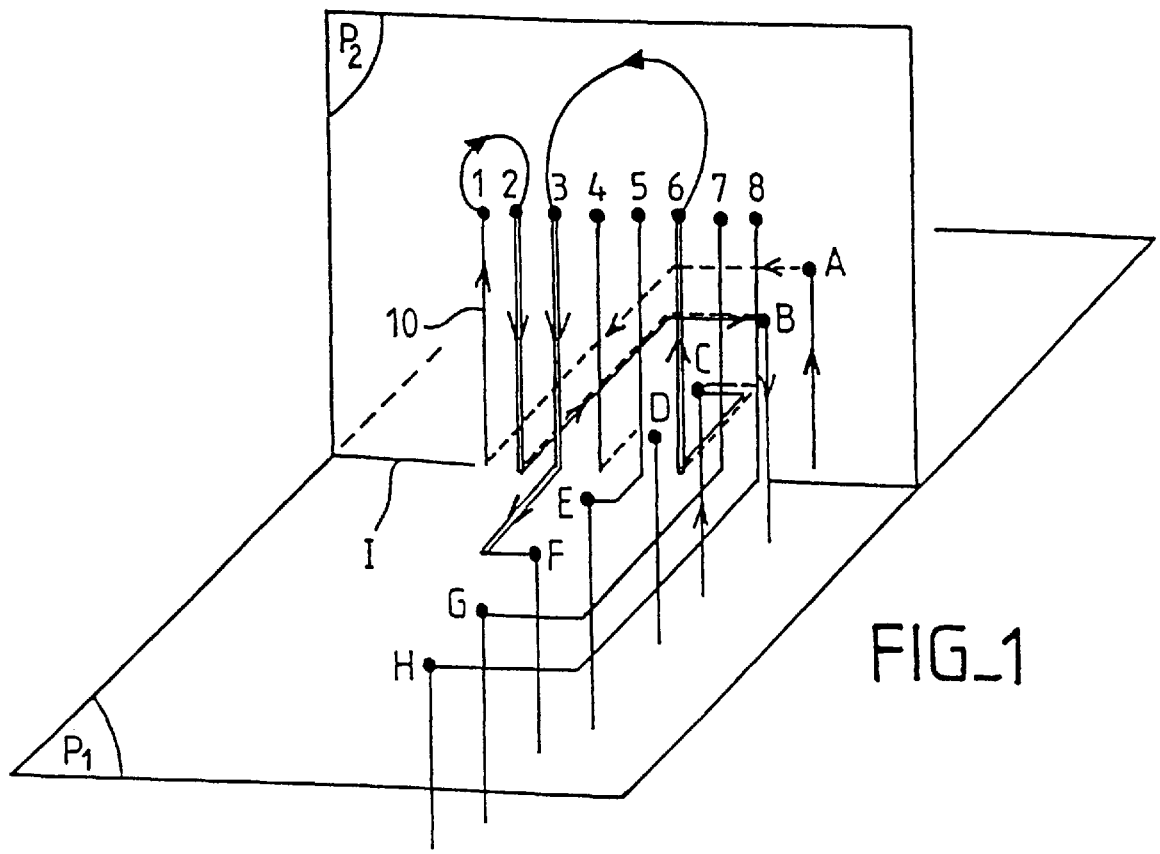
FIG_1
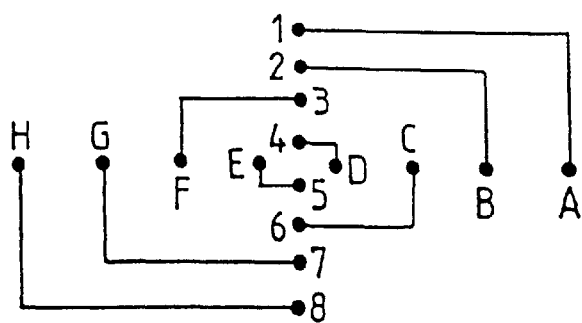
FIG_2

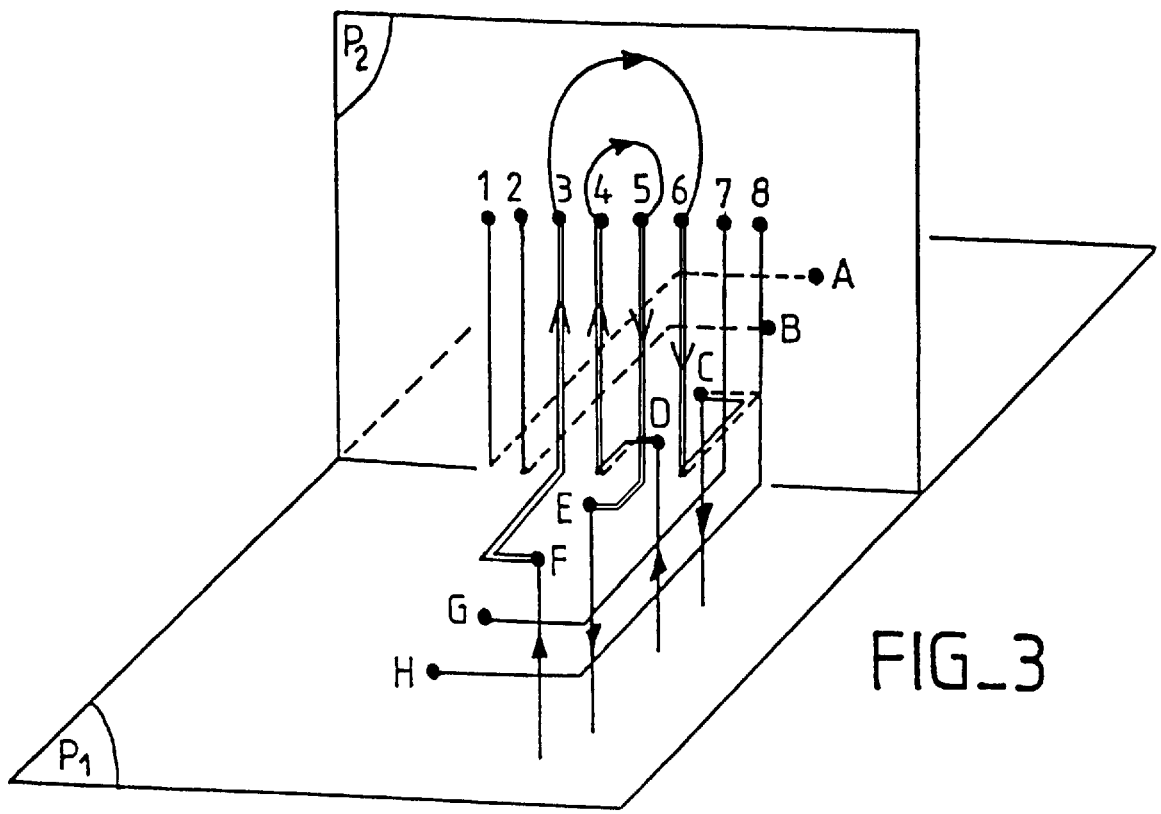
FIG_3
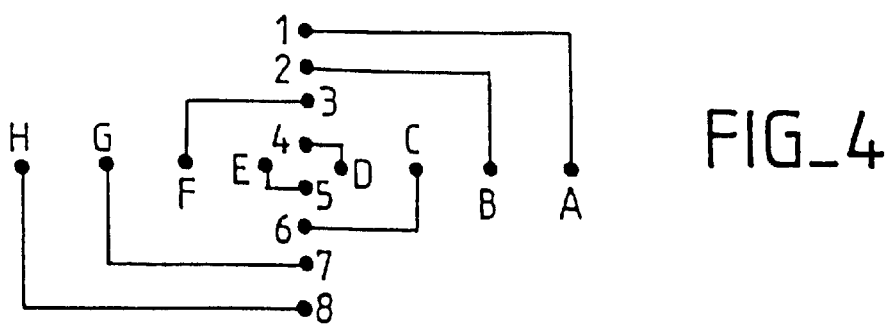
FIG_4

FIG_5
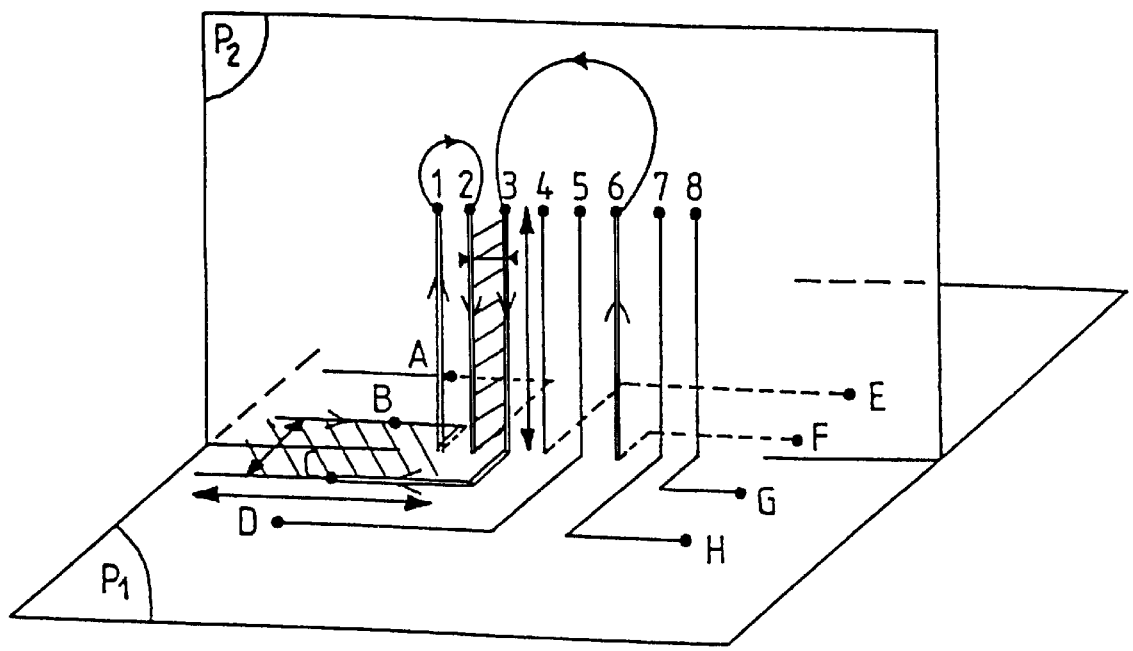
FIG_6
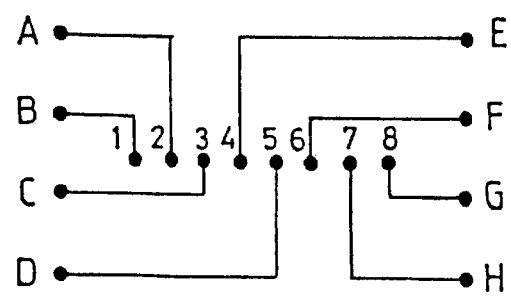

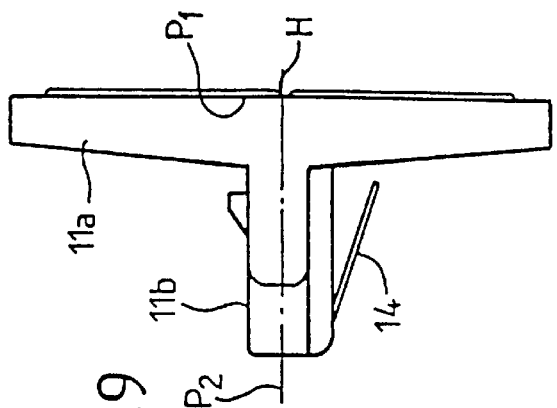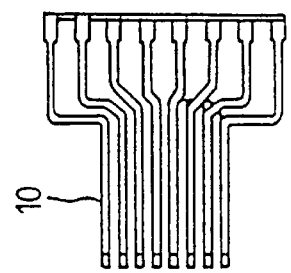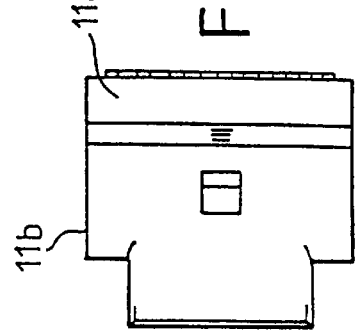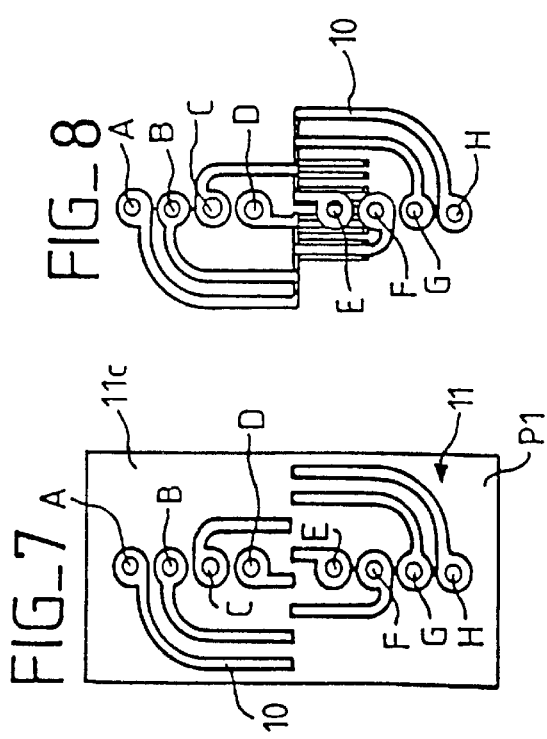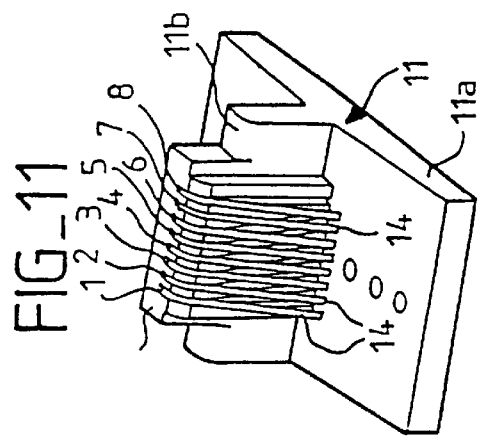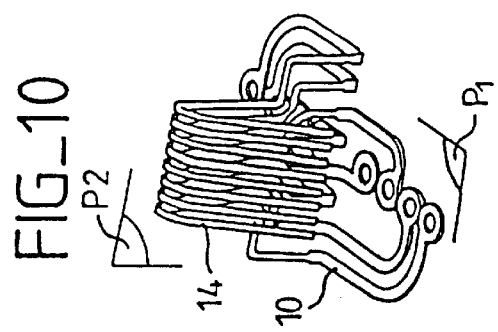

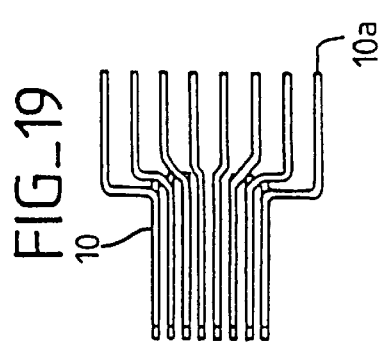
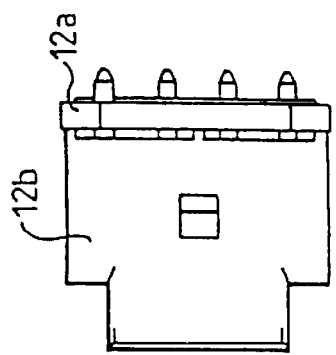
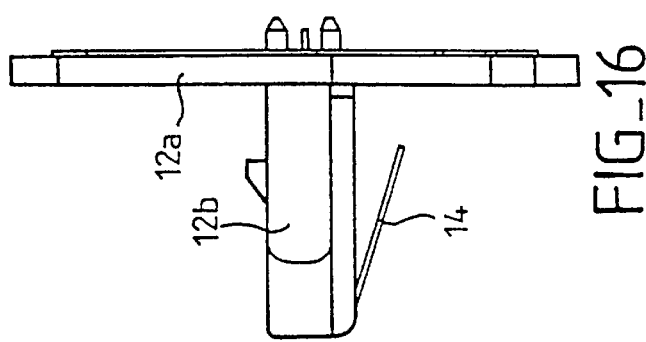
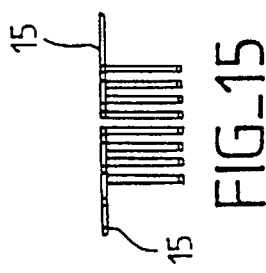
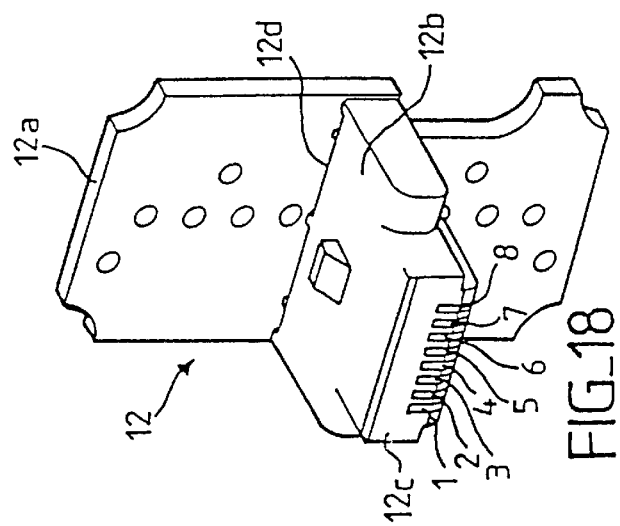
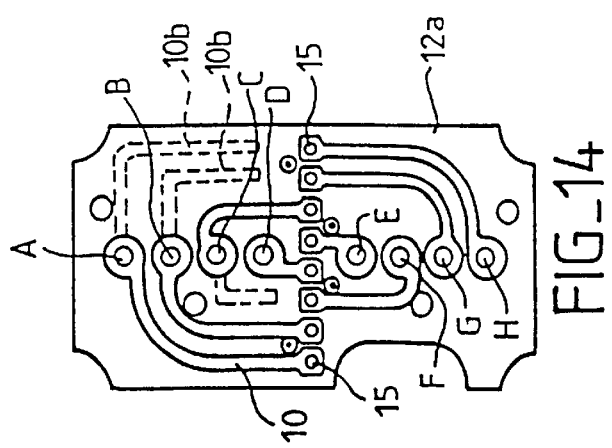
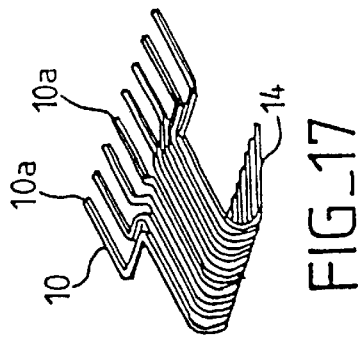

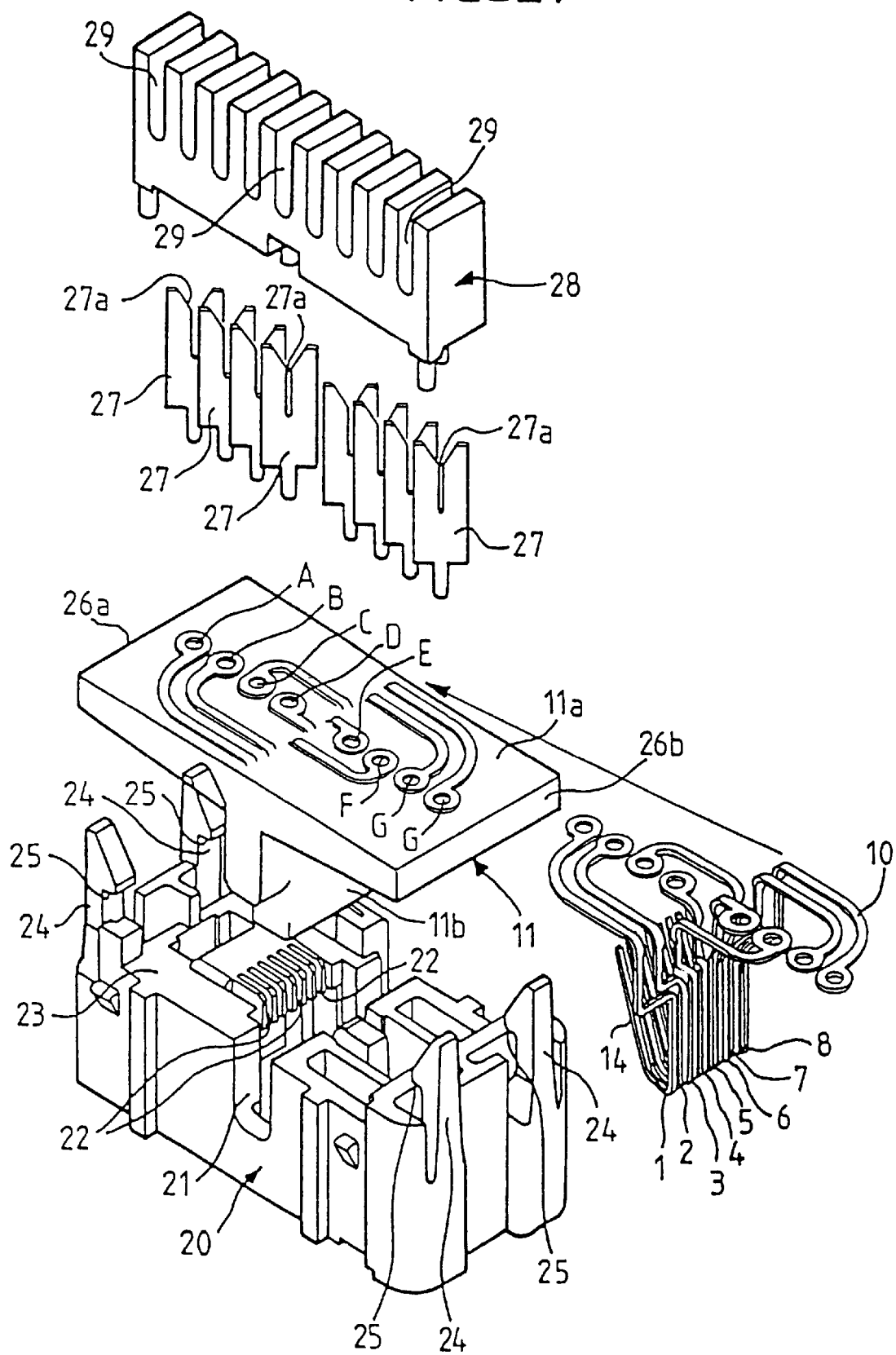
FIG_21

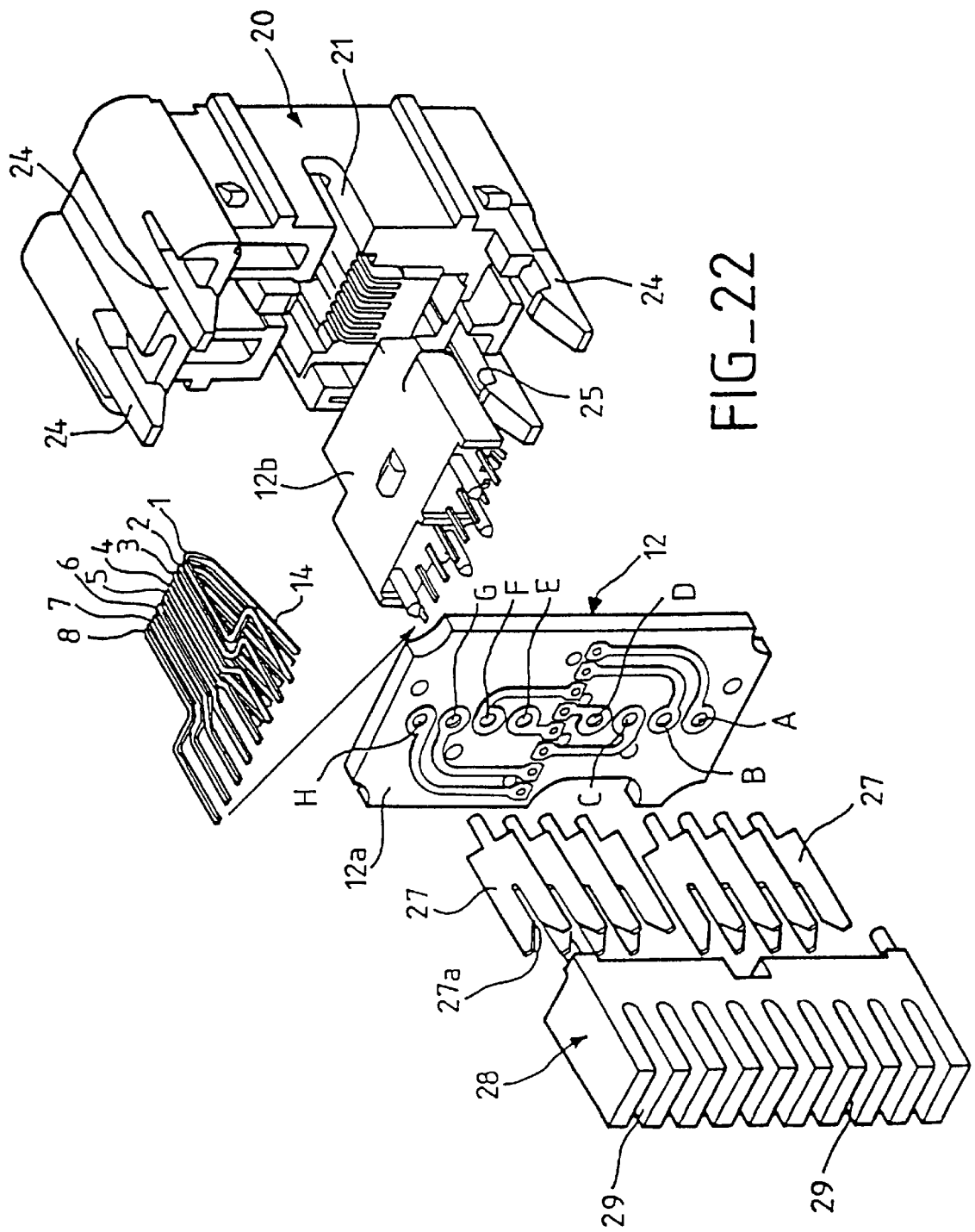
FIG_22

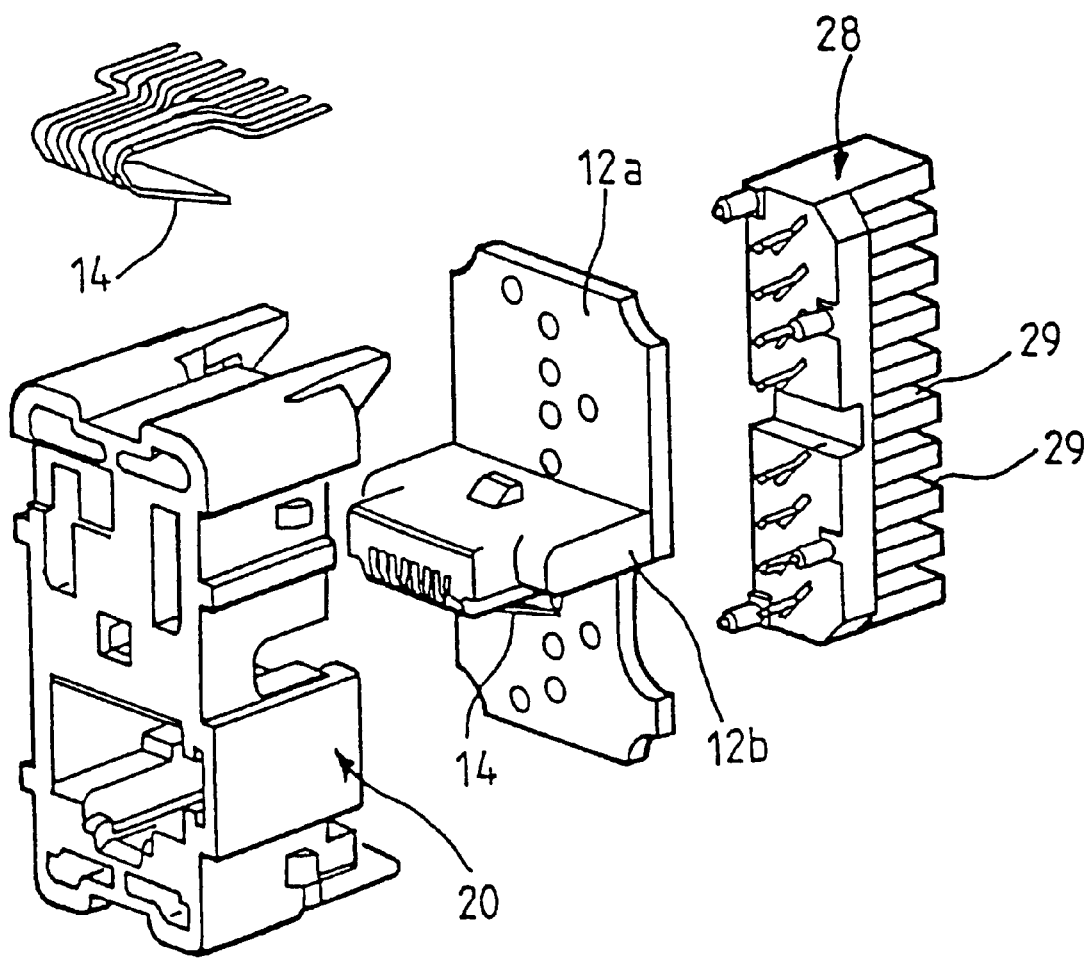
FIG_23

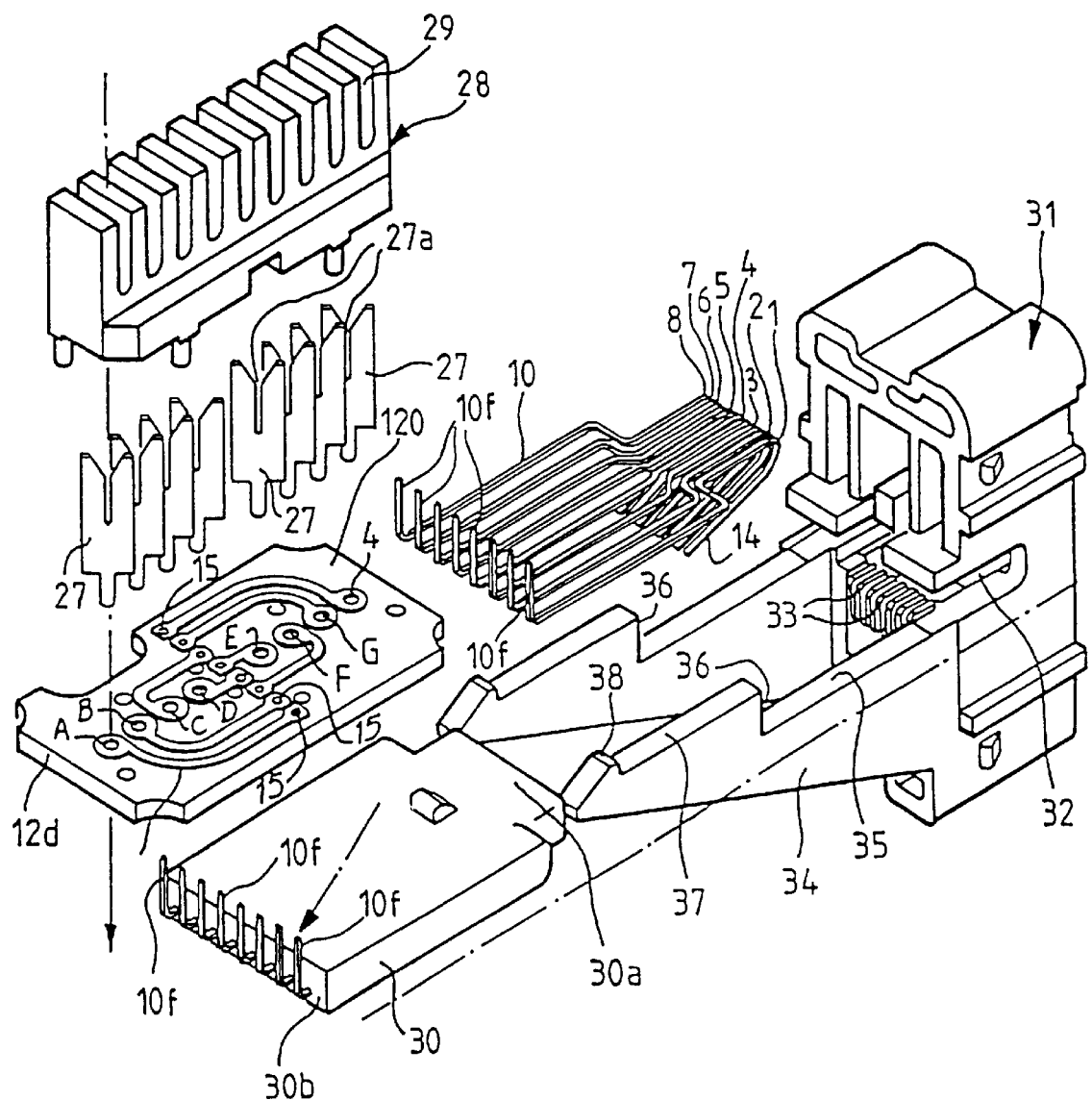
FIG_24

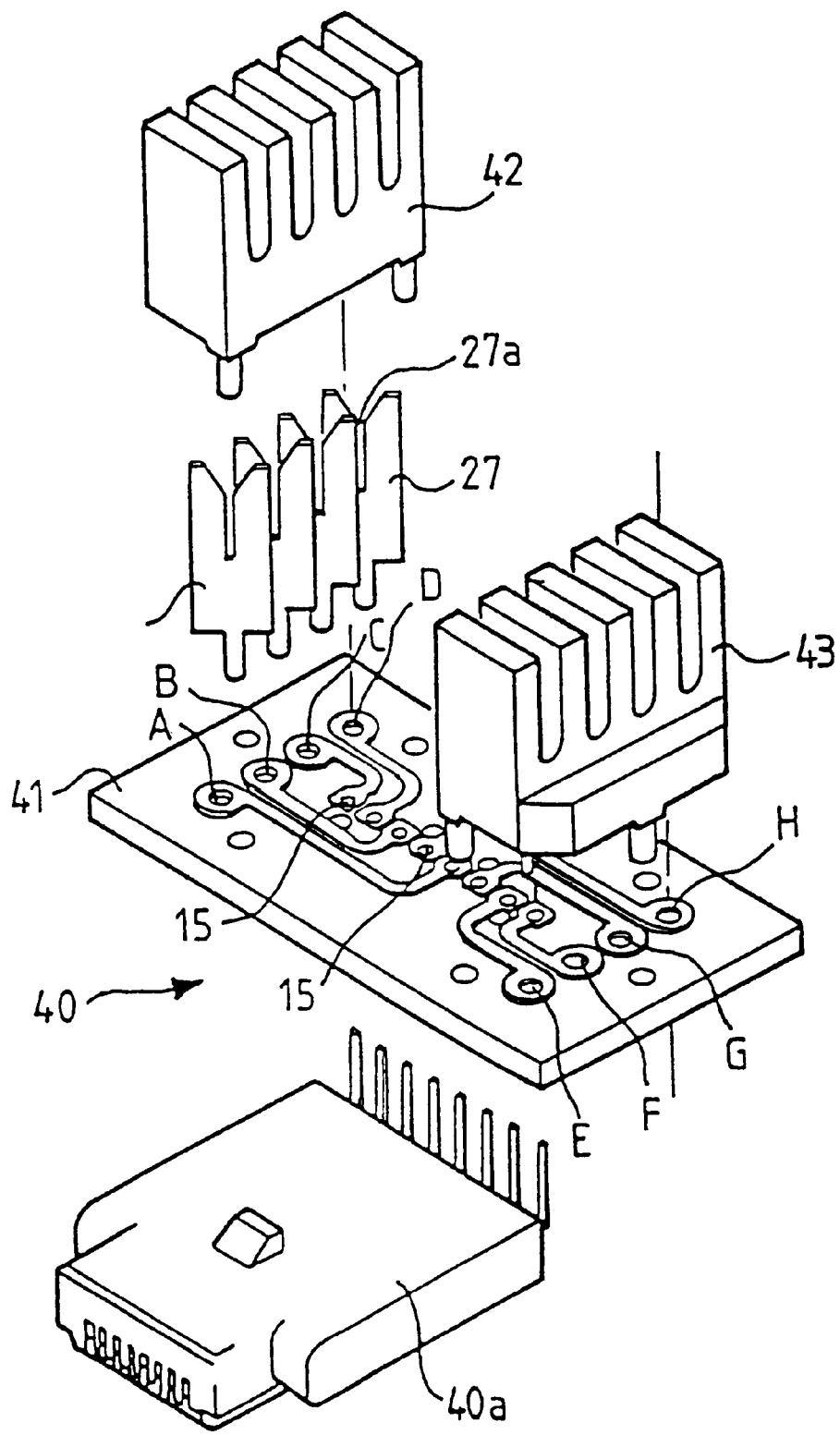
FIG_25

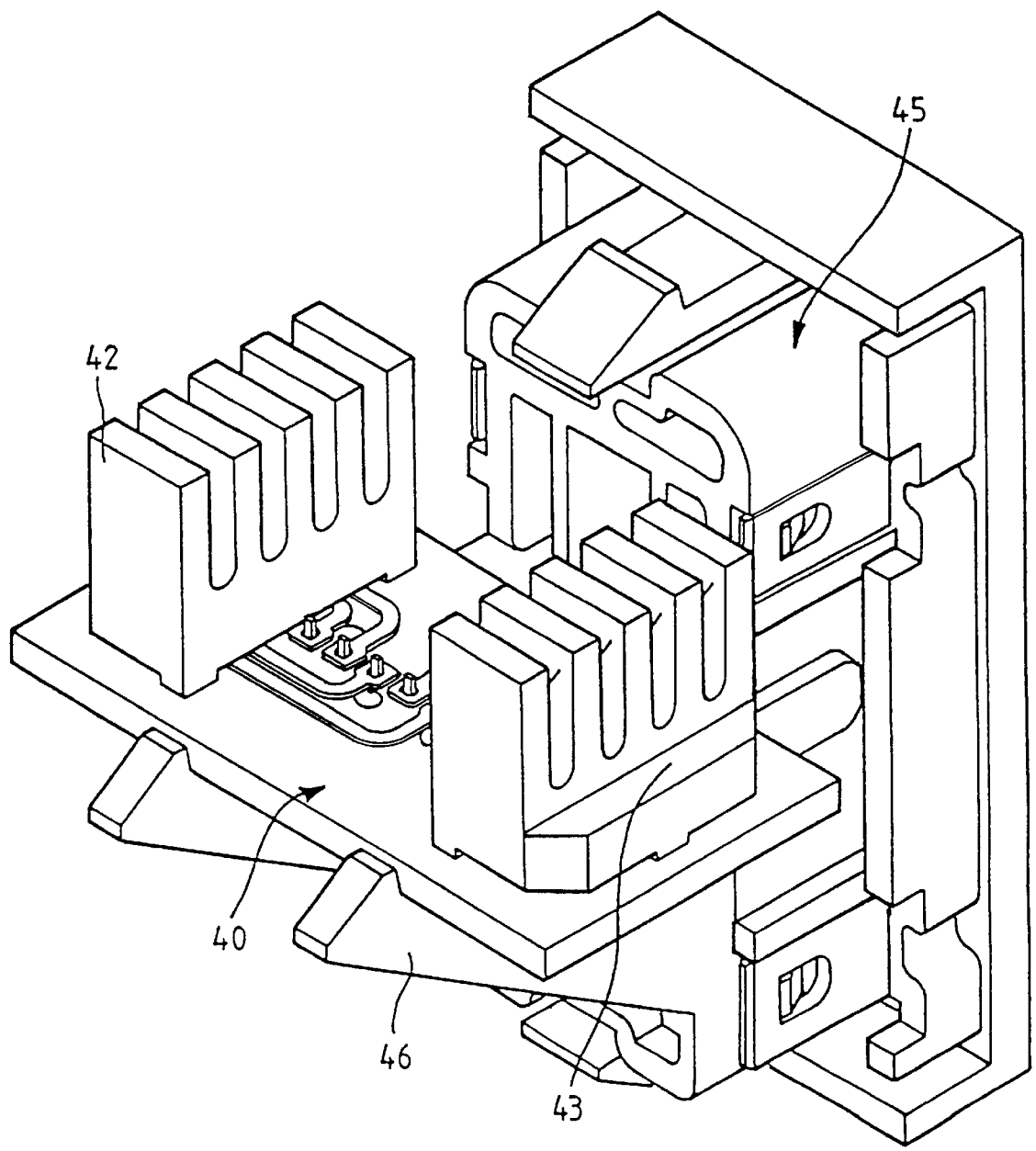

LOW CROSS-TALK NETWORK CONNECTOR

BACKGROUND OF THE INVENTION

The present invention concerns an electrical connector comprising a plurality of inputs and a plurality of outputs electrically interconnected by means of spaced electrical conductors mounted on an electrically insulative surface.

The electrical connector with which the invention is concerned is intended particularly for high bit rate network jacks in which the conductors carry electrical signals at frequencies above 1 MHz.

These jacks are of the "telephone jack" or RJ45 type. Examples of such jacks are described in FR-A-2 694 456 and U.S. Pat. No. 5,186,647. These jacks comprise a jack body that is mounted on a chassis or a wall-mounting box. The jack body includes a base plate provided with wire contacts adapted to make the connection to a complementary plug.

For signals at frequencies below 1 MHz, cross-talk is compensated by transposition of the conductors connected to the base plate, i.e. by twisting them in pairs. However, cross-talk compensation is insufficient when the frequency of the signal exceeds 1 MHz and it is necessary to compensate it at the level of the contacts in the jacks and therefore to cross the inputs and the outputs over in pairs.

In the case of RJ45 type jacks, the standard arrangement establishes the following correspondence between the contact points of the inputs and the outputs:

1-A, 2-B, 3-F, 4-D, 5-E, 6-C, 7-G, 8-H, the digits 1, 2, 3, 4, 5, 6, 7, 8 corresponding to the outputs of the connector and the letters A, B, C, D, E, F, G, H to the inputs.

With a view to compensating cross-talk patent U.S. Pat. No. 5,186,647 teaches the crossing over of conductors in the form of uninsulated wires in an area in which the wires are parallel.

This solution necessitates the production of conductors provided with crossover areas in the region in which they are retained in the insulation and requires the insulation to be provided with multiple separator partitions. This solution is difficult to implement for crossing over non-contiguous wires.

The aim of the present invention is to remedy this drawback.

SUMMARY OF THE INVENTION

Accordingly, the invention is directed to an electrical connector comprising a plurality of inputs and a plurality of outputs electrically interconnected by means of spaced electrical conductors mounted on an electrically insulative surface.

In accordance with the invention, this connector is characterized in that the inputs are in a first plane of said surface and the outputs are in a second plane of said surface, each input being connected to the corresponding output by a conductor that has a first part in the first plane and a second part in the second plane, the two parts being joined together at the intersection of the two planes, and in that the inputs are symmetrically aligned about the intersection between the two planes.

Thus the invention transposes the conductors by a simultaneous change of plane of all the connection points, without the conductors crossing over. This change of plane considerably reduces magnetic coupling between the conductors (i.e. cross-talk).

This principle allows any input/output transposition configuration without increasing the length of the conductors.

In a preferred version of the invention the two planes of the insulative surface are perpendicular.

The outputs are preferably parallel to the intersection of the two planes and the conductors in the plane of the outputs are preferably parallel to each other.

In a first version the inputs are disposed in two rows.

In a second version the inputs are aligned in a single row.

Another feature of the present invention concerns the base plate of the network jack which is molded in one piece from plastics material, the conductors being either molded into the base plate or inserted into openings formed in the base plate.

In accordance with another feature of the present invention, the base plate may also include a first substantially parallelepiped-shape block surmounted by a second block extending vertically from the middle of the first block, the inputs being aligned on the face of the first block opposite the second block, the outputs being aligned on the top of the second block and extended by conductive blades bent towards a lateral face of the second block.

In this case, the base plate may be in two separate parts, one comprising a plate on which some of the conductors connected to the inputs are printed and the other comprising a block into which the remainder of the conductors connected to the outputs are molded or inserted, said block being removably fixed to the plate to make a connection between the two parts of the conductors.

The conductors connected to the inputs can terminate on the plate in end portions having openings aligned in a direction perpendicular to the inputs, the conductors connected to the outputs terminating at the base of the block in end portions entering the aforementioned openings to make the electrical contact between said end portions of the conductors.

To compensate for capacitance, the inputs can be extended by conductors ending in dead ends.

The housing may comprise on the edges of its face adjacent the base plate projecting lugs with snap-fastener hooks adapted to engage with two opposite edges of the block incorporating the inputs on the base plate for fixing the latter removably to the receiving housing.

Finally, the inputs on the base plate (11, 12) situated opposite the receiving housing can each receive a slotted conductive blade, said blades being capped by an insulative block fixed removably to the base plate and including notches for inserting the input conductor wires, the slots in said blades being adapted to make the connections to said wires.

In all cases, the invention enables interconnection of the outputs 1, 2, 3, 4, 5, 6, 7, 8 and the inputs A, B, C, D, E, F, G, H with the configuration: 1-A, 2-B, 3-F, 4-D, 5-E, 6-C, 7-G, 8-H.

Other features and advantages of the invention will emerge from the following description.

In the accompanying drawings, given by way of nonlimiting example:

BRIEF DESCRIPTION OF DRAWINGS

FIG. 1 is a diagram showing the interconnections of the inputs and the outputs located in two different planes in a first version of the invention;

FIG. 2 is a projection in the plane of the inputs of the interconnections from FIG. 1;

FIG. 3 is a diagram analogous to that of FIG. 1, relating to a second version of the invention;

FIG. 4 is a projection into the plane of the inputs of the interconnections from FIG. 3;

FIG. 5 is a diagram analogous to FIG. 1, relating to a third version of the invention;

FIG. 6 is a projection into the plane of the inputs of the interconnections from FIG. 5;

FIG. 7 is a plan view of a base plate of a connector of the invention;

FIG. 8 is a view in the plane of the inputs of the interconnection conductors;

FIG. 9 is a side view of the base plate;

FIG. 10 is a perspective view of the interconnection conductors;

FIG. 11 is a perspective view of the base plate;

FIG. 12 is a view on a plane perpendicular to that of FIG. 8 of the interconnection conductors;

FIG. 13 is a view on a plane perpendicular to that of FIG. 7 of the base plate;

FIG. 14 is a plan view of a base plate comprising a printed conductor plate;

FIG. 15 is a plan view of the interconnection conductors;

FIG. 16 is a side view of the base plate;

FIG. 17 is a perspective view of the interconnection conductors;

FIG. 18 is a perspective view of the base plate;

FIG. 19 is a plan view of the interconnection conductors;

FIG. 20 is a plan view of the base plate in a plane perpendicular to that of FIG. 14;

FIG. 21 is an exploded view of a connector of the invention comprising a one-piece base plate and a receiving housing;

FIG. 22 is a view analogous to FIG. 21 concerning a different embodiment;

FIG. 23 is an exploded perspective view of the embodiment from FIG. 22;

FIG. 24 is an exploded perspective view of a base plate/receiving housing combination of a second embodiment;

FIG. 25 is an exploded perspective view of a third embodiment;

FIG. 26 is a perspective view showing the base plate from FIG. 25 mounted in a receiving housing.

DESCRIPTION OF THE PREFERRED EMBODIMENTS

FIG. 1 is a schematic representation of electrical connectors comprising a plurality of inputs A, B, C, D, E, F, G, H and a plurality of outputs 1, 2, 3, 4, 5, 6, 7, 8 electrically interconnected by means of spaced electrical conductors 10 disposed on an electrically insulative surface $P_1$, $P_2$.

In accordance with the invention, the inputs A, . . . , H are in a first plane $P_1$ of the electrically insulative surface and the outputs 1, . . . , 8 are in a second plane $P_2$ of that surface. Each input A, . . . , H is connected to the corresponding output 1, . . . , 8 by a conductor that has a first part in the plane $P_1$ and a second part in the plane $P_2$, these two parts being joined together substantially at right angles at the intersection of the two planes $P_1$, $P_2$, there being no crossing over between the conductors.

In the examples shown the two planes $P_1$, $P_2$ are perpendicular.

The outputs 1, 2, 3, 4, 5, 6, 7, 8 are aligned parallel to the intersection I of the two planes $P_1$, $P_2$ and the conductors 10 in the plane $P_2$ of the outputs 1, . . . , 8 are parallel to each other.

In FIGS. 1 through 4 the inputs A, . . . , H are aligned in a single row that is symmetrical about the intersection I between the two planes $P_1$, $P_2$.

In FIGS. 5 and 6 the inputs are disposed in two parallel rows A, B, C, D and E, F, G, H symmetrical about the intersection I between the two planes $P_1$, $P_2$.

In FIGS. 1 through 4 the electrical connections between the inputs and the outputs are:

1-A; 2-B; 3-F; 4-D; 5-E; 6-C; 7-G; 8-H.

In the case of FIGS. 5 and 6, these connections are:

1-B; 2-A; 3-C; 4-E; 5-D; 6-F; 8-G.

These diagrams provide a basis for high-frequency network jacks of the "telephone jack" or "RJ45" type, for example, featuring very low cross-talk.

A few embodiments of electrical connectors employing the above principle will now be described with reference to FIGS. 7 through 20.

In these embodiments, the inputs A, B, C, D, E, F, G, H and the outputs 1, 2, 3, 4, 5, 6, 7, 8 are electrically interconnected by spaced electrical conductors 10 on an electrically insulative base plate 11, 12.

The base plate 11, 12 has two perpendicular planes $P_1$, $P_2$, the inputs A, . . . , H being in a first plane $P_1$ and the outputs 1, . . . , 8 being in a second plane $P_2$. Each input A, . . . , H is connected to the corresponding output 1, . . . 8 by a conductor 10 that has a first part in the first plane $P_1$ and a second part in the second plane $P_2$, the two parts being joined together substantially at right angles at the intersection I of the two planes $P_1$, $P_2$, there being no crossover between the conductors.

In the example shown in FIGS. 7 through 13 the base plate 11 is molded in one piece from plastics material.

The conductors 10 can be molded into the base plate 11. The conductors 10 can instead be inserted into openings formed in the base plate 11.

As shown in FIGS. 9, 11 and 13, the base plate 11 comprises a substantially parallelepiped-shape first block 11a surmounted by a second block 11b extending vertically from the middle of the first block 11.

The inputs A, . . . , H are aligned on the face 11c of the first block 11a opposite the second block 11b and the outputs 1, . . . , 8 are aligned on the top 13 of the second block 11b. Moreover, these outputs 1, . . . , 8 are extended by conductive blades 14 bent towards a lateral face of the second block 11b.

The inputs A, . . . , H are aligned on the face 11c of the base plate in a direction perpendicular to the alignment of the outputs 1, . . . , 8.

In the embodiment of FIGS. 14 through 20 the base plate 12 is in two separate parts 12a, 12b. The part 12a is an insulative plate on which are printed some of the conductors 10 connected to the inputs A, B, C, D, E, F, G, H and the other part 12b is a block 12b into which the remainder of the conductors 10 connected to the outputs 1, 2, 3, 4, 5, 6, 7, 8 are molded or inserted. The block 12b is removably fixed to the plate 12a to make a connection between the two parts of the conductors 10.

The conductors connected to the outputs 1, . . . , 8 project from the top 12c of the block 12b and are extended by blades 14 bent towards a lateral face of this block.

The conductors 10 connected to the inputs A, . . . , H end on the plate 12a in end portions having openings 15 aligned in a direction perpendicular to the inputs A, . . . , H. The conductors connected to the outputs 1, . . . , 8 end at the base 12e of the block 12b in end portions 10a entering the previously mentioned openings 15 to make the electrical contact between the end portions of the conductors.

The block 12b could equally well be fixed flat against the plate 12d. In this case, the block would have on one side projecting end portions of conductors molded and inserted into the block, these projecting end portions being bent perpendicularly to the plate and inserted in aligned openings at the ends of the conductors carried by the plate.

In this case, the block 12b would have on its other side projecting end portions of the conductors, these projecting end portions being curved and bent towards the face of the block opposite the plate.

The inputs A, . . . , H could instead be arranged in two parallel rows.

As shown in FIG. 15, to compensate for capacitance the inputs A, . . . , H can be extended by conductors 10b ending in blind ends.

FIG. 21 shows a low cross-talk network jack comprising an insulative material base plate 11 including a plurality of inputs A, . . . , H and a plurality of outputs 1, . . . , 8 electrically interconnected by means of spaced electrical conductors 10. The base plate 11 is in one piece and is identical to that shown in FIG. 11. This base plate 11 is removably mounted in a receiving housing 20 including means for making the electrical connections between the outputs 1, . . . , 8 of the base plate 11 and exterior output conductor wires (not shown). The inputs A, . . . , H on the base plate 11 are connected to means for making the electrical connections with exterior input conductor wires.

As previously indicated, the base plate 11 has two substantially perpendicular planes, the inputs A, . . . , H being in a first plane and the outputs 1, . . . , 8 being in a second plane, each input being connected to the corresponding output by a conductor that has a first part in the first plane and a second part in the second plane, the two parts being joined together at the intersection of the two planes, there being no crossover between the conductors.

The base plate 11 comprises a substantially parallelepiped-shape block 11a having on one face aligned inputs A, . . . , H and on the opposite face a block 11b projecting vertically from this face and from which project conductive blades 14 constituting the outputs aligned in a direction perpendicular to the inputs. The blades 14 are bent towards a projecting lateral face of the block 11b.

The receiving housing 20 includes an opening 21 receiving the block 11b projecting from the base plate 11.

The opening 21 has on its face adjacent to the bent conductive blades 14 of the block 11b of the base plate notches 22 each adapted to receive one conductive blade 14 of the block 11b. These blades 14 come into contact with external output conductor wires (not shown).

FIG. 21 also shows that the housing 20 has on the edges of its face 23 adjacent the base plate 11 projecting lugs 24 with snap-fastener hooks 25 engaging with two opposite edges 26a, 26b of the block 11a including the inputs A, . . . , H of the base plate 11 to fix the latter removably to the face 23 of the receiving housing 20.

The inputs A, . . . , H on the base plate 11 opposite the connection housing 20 each receive a conductive blade 27 incorporating a slot 27a. The blades 27 are capped by an insulative block 28 removably fixed to the base plate 11. The block 28 includes notches 29 into which the input conductor wires are inserted; the slots 27a in the blades 27 make the connections to said wires by displacement of their exterior insulation.

FIG. 22 is identical to FIG. 21 except that the base plate 12 is in two part 12a, 12b as in FIG. 18.

FIG. 23 shows the same assembly as FIG. 22 from a different direction.

In the FIG. 24 embodiment, the base plate 12 comprises a plate 12a having the inputs A, . . . , H on one face. This plate 12a is identical to that shown in FIG. 14. The plate 12a is pressed against a substantially parallelepiped-shape block 30 from one side of which project end portions 10f of conductors 14 bent at 90° towards the plate 12a. The end portions 10f of these conductors are inserted in openings 15 in the plate 12a through which they are connected to the conductors 10 connected to the inputs A, . . . , H.

The opposite side of the substantially parallelepiped-shape block 30 has projecting end portions of conductors 14 bent towards the face of the block opposite the plate 12a.

The receiving housing 31 includes an opening 32 to receive the side 30a of said block from which the bent end portions 14 of the conductors 10 project. This opening 32 has on the face adjacent the bent end portions 14 of the conductors notches 33 each adapted to receive one of said end portions 14 to make the electrical connection with the output conductor wires. The receiving housing 31 further includes on its face adjacent the opening 32 a protuberance 34 having a recessed face 35 with a shoulder 36 opposite the opening 32 in the housing. When the side 30a of the substantially parallelepiped-shape block 30 is inserted in the opening 32, its opposite side 30b is pressed against the shoulder 36.

FIG. 24 also shows that the protuberance 34 is extended beyond the shoulder 36 by a bearing surface 37 of the plate 12a pressed onto the block 30. To this end the end of the protuberance 34 has a shoulder 38 for locating the edge 12d of the plate 12a.

FIG. 25 shows a base plate 40 in two parts, one being a plate 41 on which the conductors are printed, the inputs A, . . . , H being disposed in two parallel rows. The block 40a including the conductors connected to the outputs 1, . . . , 8 is identical to the block shown in FIG. 18.

The contact blades 27 adapted to be connected to the external conductor wires are capped by two insulative blocks 42, 43 disposed on top of the two rows of inputs A, B, C, D and E, F, G, H.

FIG. 26 shows a receiving housing that receives the above base plate 40. As in the FIG. 24 embodiment, the housing 45 comprises lateral protuberances 46 for locating the base plate 40.

I claim:

1. Low cross-talk network jack comprising an insulative material base plate (11, 12, 30, 40) including a plurality of inputs (A, . . . , H) and a plurality of outputs (1, . . . , 8) electrically interconnected by means of spaced electrical conductors, said base plate being removably mounted in a receiving housing (20, 31, 45) including means for making electrical connections between the outputs on the base plate and external output conductor wires, the inputs (A, . . . , H) on the base plate being connected to means for making electrical connections with external input conductor wires, characterized in that said base plate (11, 12, . . . ) has two substantially perpendicular planes, the inputs (A, . . . , H) being in a first plane and the outputs (1, . . . , 8) being in a second plane, each input being connected to the corresponding output by a conductor that has a first part in the first plane and a second part in the second plane, the two parts being joined together at the intersection of the two planes, and in that the inputs are symmetrically aligned about the intersection (I) between the two planes ($P_1$, $P_2$).

2. Network jack according to claim 1 characterized in that the outputs (1, . . . , 8) are aligned parallel to the intersection (I) of the two planes ($P_1$, $P_2$) and in that the conductors (10) in the plane ($P_2$) of the outputs (1, . . . , 8) are parallel to each other.

3. Network jack according to claim 1, characterized in that the inputs (A, . . . , H) are disposed in two parallel rows symmetrical about the intersection (I) between the two planes.

4. Network jack according to claim 1, characterized in that the inputs (A, . . . , H) are aligned in a single row symmetrical about the intersection (I) between two planes ($P_1$, $P_2$).

5. Network jack according to claim 1, characterized in that the base plate (11) is molded in one piece from plastics material.

6. Network jack according to claim 5 characterized in that the conductors are molded into the base plate (11).

7. Network jack according to claim 5 characterized in that the conductors are inserted into openings in the base plate (11).

8. Network jack according to claim 1, characterized in that the base plate (11) comprises a substantially parallelepiped-shape first block (11a) surmounted by a second block (11b) extending vertically from the middle of the first block, the inputs (A, . . . , H) being aligned on the face of the first block (11a) opposite the second block (11b), the outputs (1, . . . , 8) being aligned on the top of the second block and being extended by conductive blades (14) bent towards a lateral face of the second block.

9. Network jack according to claim 8 characterized in that the base plate (12) is in two separate parts, one part (12a) comprising a plate on which some of the conductors (10) connected to the inputs (A, . . . , H) are printed and the other part (12b) comprising a block into which the remainder of the conductors (10) connected to the outputs (1, . . . , 8) are molded or inserted, said block (12b) being removably fixed to the plate (12a) to make a connection between the two parts of the conductors (10).

10. Network jack according to claim 9 characterized in that the conductors (10) connected to the inputs terminate on the plate (12a) in end portions having openings (15) aligned in a direction perpendicular to the inputs (A, . . . , H), the conductors connected to the outputs (1, . . . , 8) terminating at the base of the block in end portions (10a) entering the aforementioned openings (15) to make the electrical contact between said end portions of the conductors (10).

11. Network jack according to claim 1, characterized in that to compensate for capacitance the inputs (A, . . . , H) are extended by conductors (10b) ending at a dead end.

12. Jack according to claim 1, characterized in that the housing (20) has on the edges of its face (23) adjacent the base plate (11, 12) projecting lugs (24) provided with snap-fastener hooks (25) engaging with two opposite edges (26a, 26b) of the block including the inputs (A, . . . , H) on the base plate to fix the latter removably to the receiving housing (20).

13. Jack according to claim 1, characterized in that the inputs (A, . . . , H) on the base plate (11, 12) opposite the receiving housing (20) each receive a conductive blade (27) incorporating a slot (27a), said blades (27) being capped by an insulative block (28) removably fixed to the base plate and including notches (29) for insertion of input conductor wires, the slots in said blades being adapted to make the connections to said wires.

* * * * *